United States Patent
Zuo et al.

(10) Patent No.: US 11,380,757 B2
(45) Date of Patent: Jul. 5, 2022

(54) METAL TERMINAL EDGE FOR SEMICONDUCTOR STRUCTURE AND METHOD OF FORMING THE SAME

(71) Applicants: Zheng Zuo, Culver City, CA (US); Ruigang Li, Los Angeles, CA (US); Da Teng, Culver City, CA (US)

(72) Inventors: Zheng Zuo, Culver City, CA (US); Ruigang Li, Los Angeles, CA (US); Da Teng, Culver City, CA (US)

( * ) Notice: Subject to any disclaimer, the term of this patent is extended or adjusted under 35 U.S.C. 154(b) by 18 days.

(21) Appl. No.: 17/118,369

(22) Filed: Dec. 10, 2020

(65) Prior Publication Data

US 2021/0091177 A1    Mar. 25, 2021

Related U.S. Application Data

(63) Continuation-in-part of application No. 16/366,935, filed on Mar. 27, 2019, now abandoned.

(51) Int. Cl.
*H01L 29/06* (2006.01)
*H01L 29/872* (2006.01)
*H01L 29/16* (2006.01)

(52) U.S. Cl.
CPC ...... *H01L 29/0619* (2013.01); *H01L 29/1608* (2013.01); *H01L 29/872* (2013.01)

(58) Field of Classification Search
CPC .............. H01L 29/0619; H01L 29/872; H01L 29/1608
USPC ........................................... 257/77
See application file for complete search history.

(56) References Cited

U.S. PATENT DOCUMENTS

| 2017/0207318 A1* | 7/2017 | Li | H01L 29/6606 |
| 2020/0027953 A1* | 1/2020 | Ren | H01L 29/6606 |

\* cited by examiner

*Primary Examiner* — Igwe U Anya
(74) *Attorney, Agent, or Firm* — Che-Yang Chen; Law Office of Michael Chen

(57) ABSTRACT

In one aspect, a semiconductor device may include a semiconductor substrate formed of silicon carbide; and an edge termination having a first metal layer and a second metal layer, wherein the first metal layer is deposited and patterned spacedly on the semiconductor substrate and the second metal layer is deposited and patterned onto at least a portion of the spaced first metal layer and onto the semiconductor substrate between said spaced first metal layer, and wherein the first metal layer comprises a high work function metal, while the second metal layer comprises a low work function metal. In one embodiment, the high work function metal includes Silver, Aluminum, Chromium, Nickel, and Gold; and the low work function metal includes Titanium and Nickel Silicide.

12 Claims, 4 Drawing Sheets

METAL TERMINAL EDGE FOR SEMICONDUCTOR STRUCTURE AND METHOD OF FORMING THE SAME

CROSS-REFERENCE TO RELATED APPLICATIONS

This application is a continuation-in-part (CIP) application of Ser. No. 16/366,935 filed on Mar. 27, 2019 now pending, the entire contents of which are hereby incorporated by reference.

FIELD OF THE INVENTION

The present invention relates to semiconductor devices, and more particularly to a metal terminal edge for the semiconductor device and the method of forming the same.

BACKGROUND OF THE INVENTION

In recent years, in order to achieve high breakdown voltage, low loss, and the like in a semiconductor device, silicon carbide has begun to be adopted as a material for the semiconductor device. Silicon carbide has a wide energy bandgap, high melting point, low dielectric constant, high breakdown-field strength, high thermal conductivity, and high saturation electron drift velocity compared to silicon. These characteristics would allow silicon carbide power devices to operate at higher temperatures, higher power levels, and with lower specific on-resistance than conventional silicon based power devices. Such devices must also exhibit low reverse leakage currents. Large reverse leakage currents cause premature soft breakdown.

For power applications, silicon carbide's wide bandgap results in a high impact ionization energy. In turn, this allows SiC to experience relatively high electric fields without avalanche multiplication of ionized carriers. By way of comparison, silicon carbide's electric field capacity is about ten times as great as that of silicon.

It has been known that a Schottky diode is a semiconductor diode made by a contact of a metal with a semiconductor. Due to the difference in electron energy levels at the metal and semiconductor surface, conduction occurs over an energy barrier. This conduction is voltage and polarity dependent, which gives rise to the current-voltage curve of the diode. Good conduction occurs in the forward polarity as the current rises exponentially with voltage. However, conduction is restricted in the reverse polarity, where only a "leakage" current flows. The "leakage" current is weakly dependent on voltage. Breakdown of the diode occurs at a high reverse voltage, caused by carriers being accelerated in a very high electric field, which reaches a sufficient energy level to create an avalanche of electron-hole pairs in the semiconductor.

High voltage silicon carbide (SiC) Schottky diodes, which can handle voltages between 600V and 2.5 kV, are expected to compete with silicon PIN diodes fabricated of similar voltage ratings. Such diodes may handle as much as 100 amps of current, depending on their active area. High voltage Schottky diodes have a number of important applications, particularly in the field of power conditioning, distribution and control.

An important characteristic of a SiC Schottky diode in such applications is its switching speed. Silicon-based PIN devices typically exhibit relatively poor switching speeds. A silicon PIN diode may have a maximum switching speed of approximately 20 kHz, depending on its voltage rating. In contrast, silicon carbide-based devices are theoretically capable of much higher in excess of 100 times better than silicon. In addition, silicon carbide devices may be capable of handling a higher current density than silicon devices.

However, reliable fabrication of silicon carbide-based Schottky devices may be difficult. Typical edge termination in SiC Schottky diodes require ion implantation of p-type dopants into the crystal. Such implants may cause substantial damage to the crystal lattice, which may require high temperature annealing to repair such defects. This high-temperature anneal step (>1500° C.) may be undesirable for a number of reasons. For example, high temperature anneals tend to degrade the surface of SiC on which the Schottky contact is to be made, as silicon tends to dissociate from exposed surfaces of the crystal under such a high-temperature anneal. Loss of silicon in this manner may result in a reduced quality Schottky contact between metal and the semiconductor surface. High temperature anneals have other drawbacks as well, for example, they are typically time-consuming and expensive. Moreover, implantation of p-type (Al) dopants may cause substantial lattice damage, while other species (B) have poor activation rates.

As shown in FIGS. 1 and 2, a conventional SiC Schottky diode structure has an n-type SiC substrate on which an n$^-$ epitaxial layer, which functions as a drift region, is formed. The device typically includes a Schottky contact formed directly on the n$^-$ layer. Surrounding the Schottky contact is a p-type JTE (junction termination extension) region that is typically formed by ion implantation. The implants may be aluminum, boron, or any other suitable p-type dopant. The purpose of the JTE region is to prevent the electric field crowding at the edges, and to prevent the depletion region from interacting with the surface of the device. Surface effects may cause the depletion region to spread unevenly, which may adversely affect the breakdown voltage of the device. Other termination techniques include guard rings and floating field rings that are more strongly influenced by surface effects. A channel stop region may also be formed by implantation of n-type dopants such as Nitrogen or Phosphorus in order to prevent the depletion region from extending to the edge of the device. Therefore, there remains a need for a new and improved Schottky diode with a metal terminal edge to overcome the problems stated above.

SUMMARY OF THE INVENTION

It is an object of the present invention to provide an improved Schottky diode and a manufacturing process to form the Schottky diode on a silicon carbide (SiC) substrate.

It is another object of the present invention to provide an improved manufacturing process to form a Schottky diode having a metal edge termination without applying implantation and high temperature annealing in the process.

It is a further object of the present invention to provide a Schottky diode having a metal terminal edge with the higher work function metal on both sides, and a lower work function metal therebetween to enhance the performance of the Schottky diode.

Embodiments of the present invention provide an improved Schottky diode having a metal edge termination without the need for the process of implantation. The avoidance of the implantation may also avoid the need for a high temperature anneal which may adversely affect the characteristics of the device. In one aspect, a Schottky diode with a metal edge termination may include a substrate, a patterned first metal layer, and a second metal layer. In one embodiment, the deposition of the first metal layer can be done by, but not limited to, sputtering, e-beam evaporation, electroplating, etc. In an exemplary embodiment, the first metal layer is a high work function metal layer usually with higher Schottky barrier, which may include, but not limited to, Silver, Aluminum, Chromium, Nickel, Gold, etc.

In still an exemplary embodiment, the second metal layer is deposited and patterned onto at least a portion of the first metal layer, and onto a top surface of the substrate located between the patterned first metal layer to form a Schottky diode. In one embodiment, the second metal layer is called a low work function metal layer usually with lower Schottky barrier, which may include, but not limited to Titanium, Nickel Silicide, etc. A junction biased Schottky (JBS) bars and metal edge termination may be formed when the low work function metal layer is in direct contact with the high work function metal.

It is noted that the first metal layer has higher Schottky barrier than the second metal layer.

Comparing with conventional SiC Schottky diodes, the present invention is especially advantageous because it allows all the process steps for the production of the metal edge terminations for the SiC semiconductor components to be carried out at a temperature (<1250° C.) which is typical in silicon technology. These process steps can be carried out in a conventional silicon production line. In particular, SiC Schottky diodes can thus be manufactured, with the exception of the production of the basic SiC material and the production of the epitaxial layer, entirely independently of the known difficulties with SiC technology. Furthermore, the Schottky diode with the metal edge termination may have comparable forward performance and even better reverse performance due to the low work function metal layer in direct contact with the high work function metal.

DETAILED DESCRIPTION OF THE INVENTION

The detailed description set forth below is intended as a description of the presently exemplary device provided in accordance with aspects of the present invention and is not intended to represent the only forms in which the present invention may be prepared or utilized. It is to be understood, rather, that the same or equivalent functions and components may be accomplished by different embodiments that are also intended to be encompassed within the spirit and scope of the invention.

Unless defined otherwise, all technical and scientific terms used herein have the same meaning as commonly understood to one of ordinary skill in the art to which this invention belongs. Although any methods, devices and materials similar or equivalent to those described can be used in the practice or testing of the invention, the exemplary methods, devices and materials are now described.

All publications mentioned are incorporated by reference for the purpose of describing and disclosing, for example, the designs and methodologies that are described in the publications that might be used in connection with the presently described invention. The publications listed or discussed above, below and throughout the text are provided solely for their disclosure prior to the filing date of the present application. Nothing herein is to be construed as an admission that the inventors are not entitled to antedate such disclosure by virtue of prior invention.

For high-voltage-resistant power semiconductor components, voltage breakdowns preferably occur in the edge area, since the electrical field strength there is particularly large owing to the curvature of the doped regions as a result of the edge. In order to avoid such voltage breakdowns, edge terminations are provided, which are disposed in the form of rings and typically completely enclose the semiconductor component. The edge terminations weaken or reduce local field strength peaks in the edge area of the semiconductor component. Undesirable voltage breakdowns in the edge area can thus be avoided to enhance the performance of the semiconductor component.

As is described in more detail below, embodiments of the present invention provides an improved Schottky diode having a metal edge termination without the need for the process of implantation. The avoidance of the implantation may also avoid the need for a high temperature anneal which may adversely effect the characteristics of the device.

In embodiments of the present invention, it may also be possible to form the Schottky contact on a region of SiC which has not been exposed to ambient when a high temperature (e.g. >1500° C.) anneal is performed and, thus loss of Si during the anneal may be reduced or avoided. Accordingly, a higher quality Schottky contact may be provided.

Figure 1:
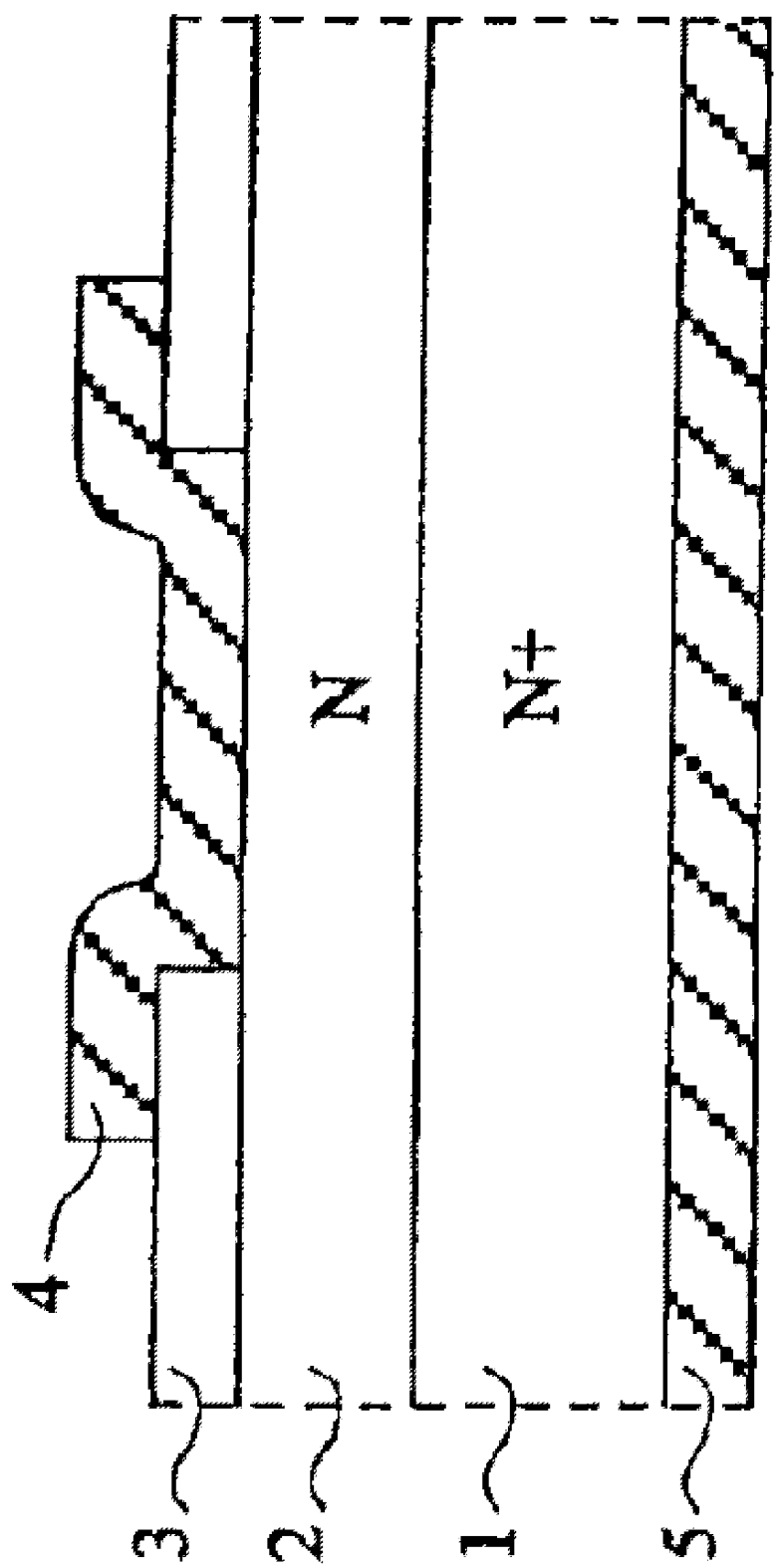
FIG. 1 illustrates a prior art to form a Schottky diode on a silicon carbide (SiC) substrate.
Figure 2:
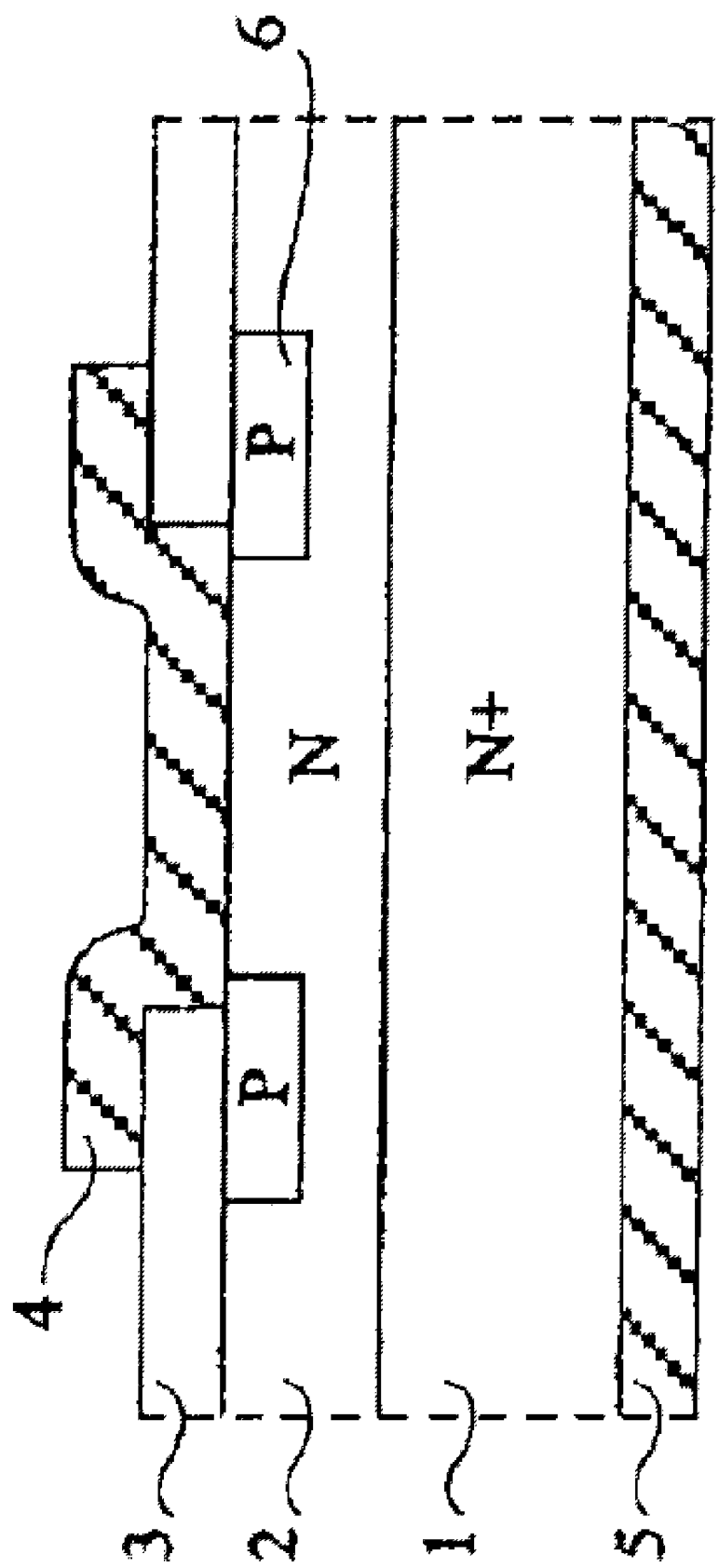
FIG. 2 illustrates another prior art to form a Schottky diode on a silicon carbide (SiC) substrate.
Figure 3:
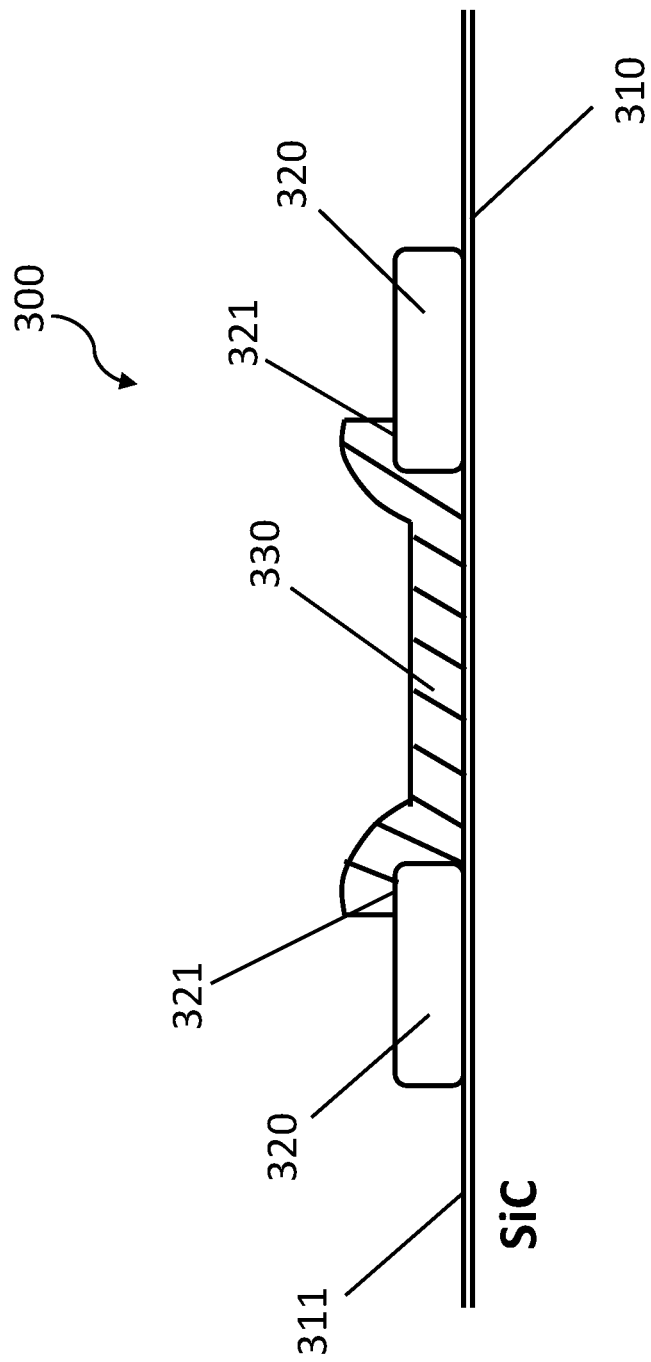
FIG. 3 is a schematic view of the SiC Schottky diode having metal edge termination structure in the present invention.
Figure 4:
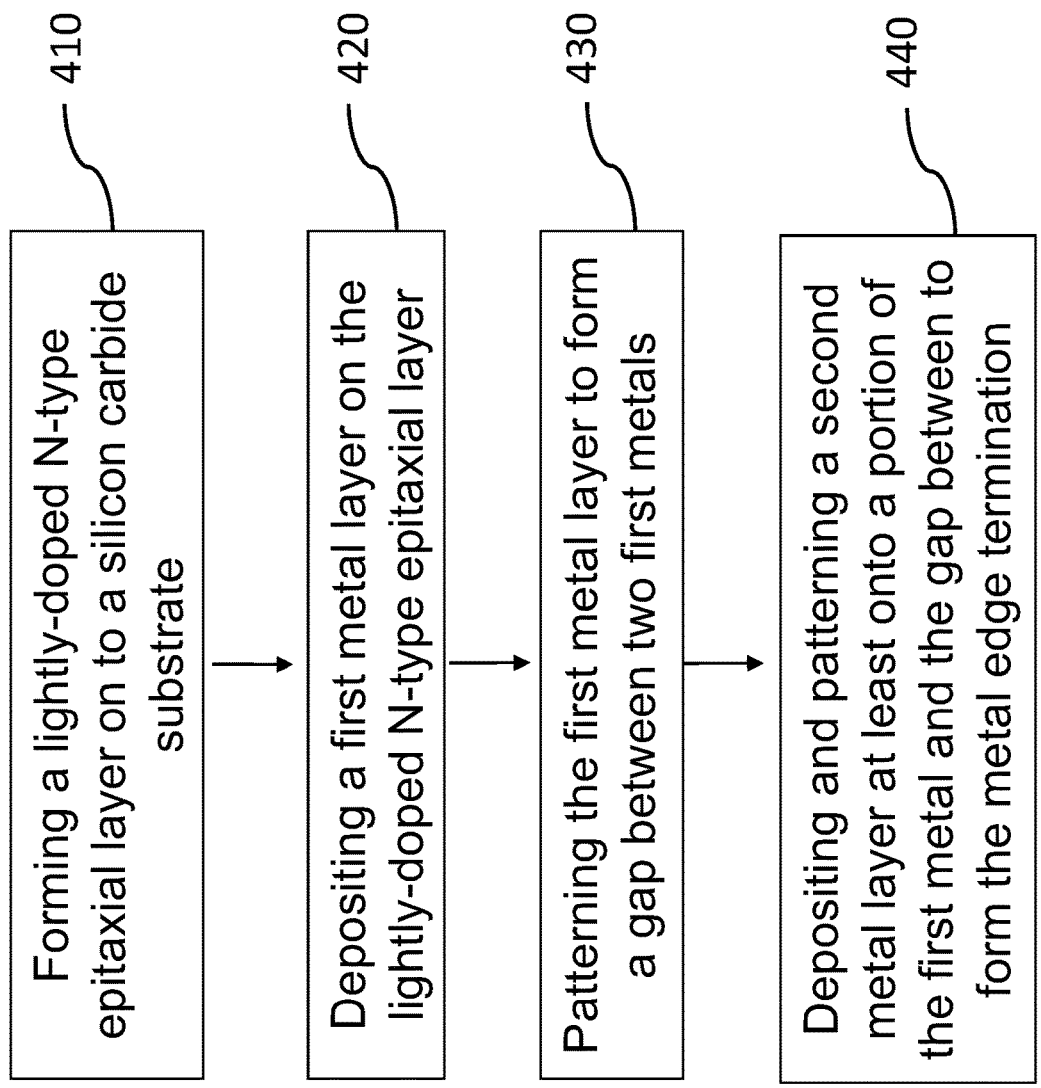
FIG. 4 illustrates a method of manufacturing a Schottky diode having metal edge termination on a silicon carbide (SiC) substrate in the present invention.

In one aspect, as shown in FIG. 3, a Schottky diode (300) with a metal edge termination may include a substrate 310 having a lightly-doped N-type epitaxial layer 311 on top of the substrate 310, a patterned first metal layer 320, and a second metal layer 330. In one embodiment, the deposition of the first metal layer 320 on the epitaxial layer 311 can be done by, but not limited to, sputtering, e-beam evaporation, electroplating, etc. In an exemplary embodiment, the first metal layer 320 is a high work function metal layer usually with higher Schottky barrier, which may include, but not limited to, Silver, Aluminum, Chromium, Nickel, Gold, etc.

In still an exemplary embodiment, the second metal layer 330 is deposited and patterned onto at least a portion of the first metal layer 320, and onto a top surface of the substrate 310 located between the spaced first metal layer 320 to form a Schottky diode. In one embodiment, the second metal layer 330 can be formed by a low work function metal layer usually with lower Schottky barrier, which may include, but not limited to, Titanium, Nickel Silicide, etc. A junction biased Schottky (JBS) bars and metal edge termination may be formed when the low work function metal layer 330 is in direct contact with the high work function metal 310. It is noted that the first metal layer 320 has higher Schottky barrier than the second metal layer 330.

In one embodiment, the material of the N-type epitaxial layer 311 has a doping concentration limit, up to $8\times10^{15}$ cm$^{-3}$. Optimal doping concentration is between 3 and $8\times10^{15}$ cm$^{-3}$. Thickness of the epitaxial layer 311 depends on intended device voltage rating, and can be up to other single or multilayer combinations.

In a further embodiment, Nickle (Ni) can be the high work-function metal 320 based on ready availability of compatible process. It is noted that Ni is especially compatible with the low work function metal Titanium (Ti). The annealing of the combination of Ni and Ti is between 580° C. and 650° C. for 1 to 2 minutes. In another embodiment, the forming of Nickel utilizes an oxidization/image inverse technique which improves process reliability, and forms additional oxides on top of Ni to enhance passivation. It is noted that Ni can deposited through evaporation or sputtering, with the thickness between 100 and 250 nm. The thickness selection is necessary that a continuous film be formed before any further process, and a combination of proper oxidizing of top of Nickel.

It is also noted that an interface layer 321 between the first metal layer 320 and the second metal layer 330 has to be more than 100 nm, and preferably 200 nm, with express purpose to form a uniform film. Further metallization of Al or AlSiCu on top is necessary to make the device viable for application. The manufacturing process in the present invention requires that Schottky annealing be performed before further anode mentalizations, thus an oxidization protection layer on top of the low work function metal layer 330 is necessary, which can be either 20 to 40 nm of Pt, or 20 to 40 nm of TiN.

In still a further embodiment, the edge termination is limited by both process considerations and electrical field considerations, and the optimal size of a single edge termination ring of the first metal is between 30 μm and 80 μm, with a minimal 10 μm overlap of the second metal on top of the first metal. It is noted that any further anode mentalizations on top of second metal and its protection layer must be within the maximum boundary of the second metal feature, and a dicing trench should be placed at least 50 μm away from outmost first metal feature, namely the edge terminal.

The present invention is especially advantageous because it allows all the process steps for the production of the metal edge terminations for the SiC semiconductor components to be carried out at a temperature (<1250° C.) which is typical in silicon technology. These process steps can be carried out in a conventional silicon production line. In particular, SiC Schottky diodes can thus be manufactured, with the exception of the production of the basic SiC material and the production of the epitaxial layer, entirely independently of the known difficulties with SiC technology. Furthermore, the Schottky diode with the metal edge termination may have comparable forward performance and even better reverse performance due to the low work function metal layer 330 in direct contact with the high work function metal 320.

In another aspect, a method for manufacturing a Schottky diode having a metal edge termination on a silicon carbide substrate may include steps of: forming a lightly-doped N-type epitaxial layer on top of the silicon carbide substrate 410; depositing a first metal layer on the lightly-doped N-type epitaxial layer 420; patterning the first metal layer to form a gap between two first metals 430; and depositing and patterning a second metal layer at least onto a portion of the first metal and the gap between to form the metal edge termination 440.

In one embodiment, the first metal layer is a high work function metal layer, which may include, but not limited to, Silver, Aluminum, Chromium, Nickel, Gold, etc. In another embodiment, the second metal layer is low work function metal layer, which may include, but not limited to Titanium, Nickel Silicide, etc.

Having described the invention by the description and illustrations above, it should be understood that these are exemplary of the invention and are not to be considered as limiting. Accordingly, the invention is not to be considered as limited by the foregoing description, but includes any equivalent.

What is claimed is:

1. A semiconductor device, comprising:
   a semiconductor substrate with a lightly-doped epitaxial layer of a first conductivity type; and
   an edge termination having a first metal layer and a second metal layer, wherein the first metal layer is deposited and patterned spacedly on the epitaxial layer and the second metal layer is deposited and patterned onto at least a portion of the spaced first metal layer and onto the epitaxial layer between said spaced first metal layer, and wherein the first metal layer comprises a high work function metal, while the second metal layer comprises a low work function metal and a junction biased Schottky (JBS) bars and the edge termination is formed when the low work function metal layer is in direct contact with the high work function metal,
   wherein an optimal size of the edge termination of the first metal is between 30 μm and 80 μm, with a minimal 10 μm overlap of the second metal on top of the first metal.

2. The semiconductor device of claim 1, wherein the high work function metal includes Silver, Aluminum, Chromium, Nickel, Gold, etc.

3. The semiconductor device of claim 1, wherein the low work function metal includes Titanium, Nickel Silicide, etc.

4. The semiconductor device of claim 1, wherein a junction biased Schottky (JBS) bars is formed when the low work function metal layer is in direct contact with the high work function metal.

5. The semiconductor device of claim 1, wherein the semiconductor substrate is silicon carbide (SiC).

6. The semiconductor device of claim 1, wherein the first metal layer has higher Schottky barrier than the second metal layer.

7. The semiconductor device of claim 1, wherein the lightly-doped epitaxial layer of a first conductivity type is a lightly-doped N-type epitaxial layer.

8. A method for manufacturing a Schottky diode having a metal edge termination on a silicon carbide substrate comprising steps of:
   forming a lightly-doped epitaxial layer of a first conductivity type on top of the silicon carbide substrate;
   depositing a first metal layer with high work function on the lightly-doped epitaxial layer of a first conductivity type;
   patterning the first metal layer to form a gap between two first metals;
   depositing and patterning a second metal layer with low work function at least onto a portion of the first metal and the gap between to form the metal edge termination, and
   forming a junction biased Schottky (JBS) bars and metal edge termination when the low work function metal layer is in direct contact with the high work function metal,
   wherein an optimal size of the edge termination ring of the first metal is between 30 μm and 80 μm, with a minimal 10 μm overlap of the second metal on top of the first metal.

9. The method for manufacturing a Schottky diode having a metal edge termination on a silicon carbide substrate of claim 8, wherein the first metal layer has higher Schottky barrier than the second metal layer.

10. The method for manufacturing a Schottky diode having a metal edge termination on a silicon carbide substrate of claim 8, wherein the lightly-doped epitaxial layer of a first conductivity type is a lightly-doped N-type epitaxial layer.

11. The method for manufacturing a Schottky diode having a metal edge termination on a silicon carbide substrate of claim 8, wherein the first metal layer includes Silver, Aluminum, Chromium, Nickel, Gold, etc.

12. The method for manufacturing a Schottky diode having a metal edge termination on a silicon carbide substrate of claim 8, wherein the second metal layer includes Titanium, Nickel Silicide, etc.

* * * * *